(12) United States Patent  
Kim

(10) Patent No.: US 8,240,649 B2  
(45) Date of Patent: Aug. 14, 2012

(54) WAFER CHUCKING APPARATUS FOR PLASMA PROCESS

(75) Inventor: Jeongtae Kim, Gwacheon-si (KR)

(73) Assignee: Tainics Co., Ltd., Suwon-Si, Gyeonggi-Do (KR)

( * ) Notice: Subject to any disclaimer, the term of this patent is extended or adjusted under 35 U.S.C. 154(b) by 73 days.

(21) Appl. No.: 12/595,212

(22) PCT Filed: Jul. 18, 2008

(86) PCT No.: PCT/KR2008/004200
§ 371 (c)(1),
(2), (4) Date: Oct. 8, 2009

(87) PCT Pub. No.: WO2009/104842
PCT Pub. Date: Aug. 27, 2009

(65) Prior Publication Data
US 2010/0327508 A1    Dec. 30, 2010

(30) Foreign Application Priority Data

Feb. 22, 2008  (KR) .................. 10-2008-0016147

(51) Int. Cl.
*C23F 1/00* (2006.01)
(52) U.S. Cl. .................. 269/287; 269/21; 269/289 R
(58) Field of Classification Search .................. 269/287, 269/74, 55, 57, 21, 289 R, 302.1, 291
See application file for complete search history.

(56) References Cited

U.S. PATENT DOCUMENTS

| | | | | |
|---|---|---|---|---|
| 5,280,894 A | * | 1/1994 | Witcraft et al. ............... | 269/287 |
| 5,590,870 A | * | 1/1997 | Goellner ..................... | 269/21 |
| 5,842,690 A | * | 12/1998 | Lee et al. .................. | 269/21 |
| 6,179,694 B1 | * | 1/2001 | Quek ......................... | 451/286 |
| 6,286,825 B1 | * | 9/2001 | Tseng et al. .............. | 269/287 |
| 6,343,784 B1 | * | 2/2002 | Jourde et al. ............. | 269/287 |
| 6,547,559 B1 | * | 4/2003 | Hodos ...................... | 432/253 |
| 2010/0327508 A1 | * | 12/2010 | Kim ......................... | 269/287 |

FOREIGN PATENT DOCUMENTS

| | | |
|---|---|---|
| JP | 11-265879 A | 9/1999 |
| KR | 10-1999-0042242 A | 6/1999 |
| KR | 10-2005-0092749 A | 9/2005 |
| KR | 10-0707996 B1 | 4/2007 |

OTHER PUBLICATIONS

International Search Report of International Application No. PCT/KR2008/004200 filed on Jul. 18, 2008.

* cited by examiner

*Primary Examiner* — Lee D Wilson
(74) *Attorney, Agent, or Firm* — Kile Park Goekjian Reed & McManus PLLC

(57) ABSTRACT

A wafer chucking apparatus for a plasma process includes a lower plate, on which a plurality of wafers are loaded, and an upper plate, which is coupled to an upper portion of the lower plate and fixes the loaded wafers. The upper plate is made of one of Teflon, ceramic and metal, and the lower plate is made of aluminum or ceramic. The lower plate includes a drilled gas feed hole through which gas is fed so as to uniformly maintain temperature of each wafer during the plasma process. One of more of an isothermal sheet and an isothermal coating layer is formed between the wafers and the lower plate so as to maintain temperature uniformity of the wafers. Thereby, the wafer chucking apparatus can improve uniformity of plasma-etched patterns at an edge zone of each wafer during the plasma process.

16 Claims, 2 Drawing Sheets

[Fig 1]
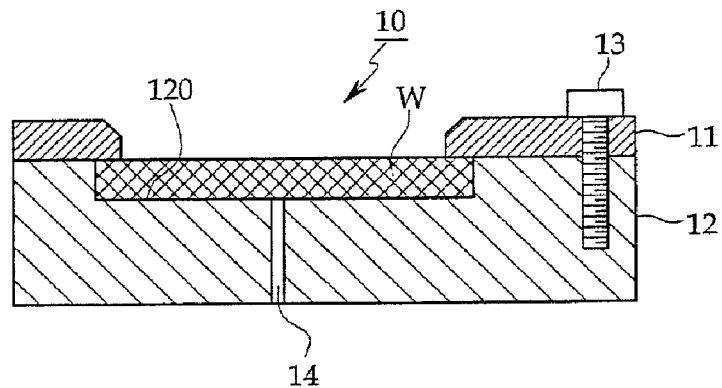
[Fig 2]
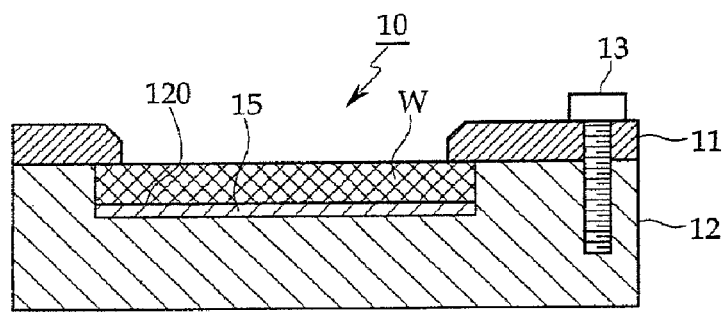
[Fig 3]
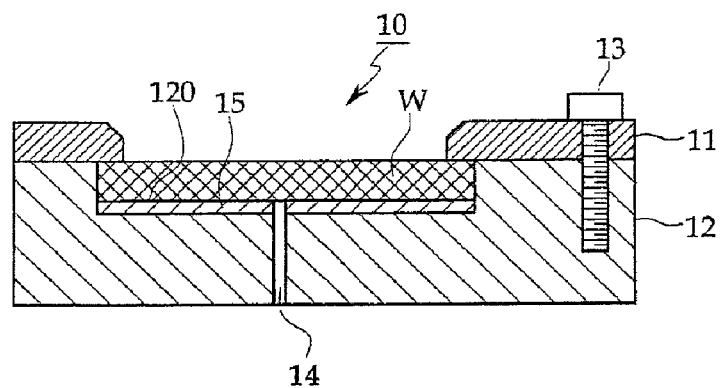

[Fig 4]
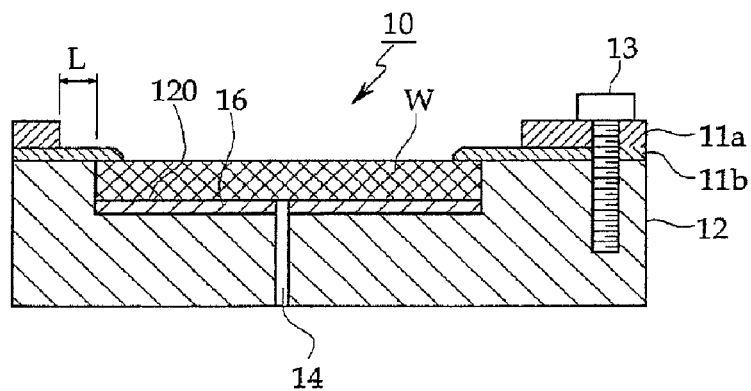
[Fig 5]
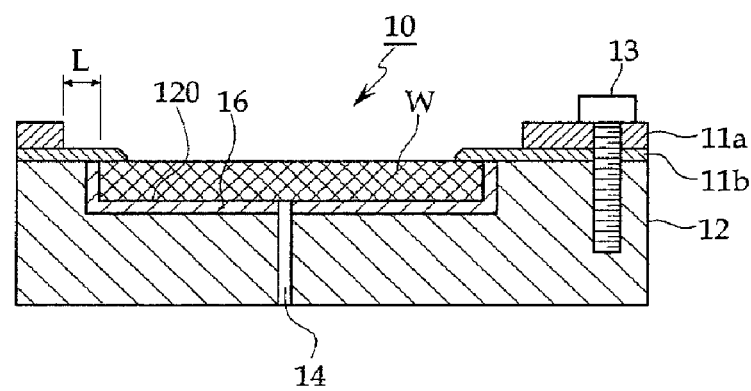
[Fig 6]
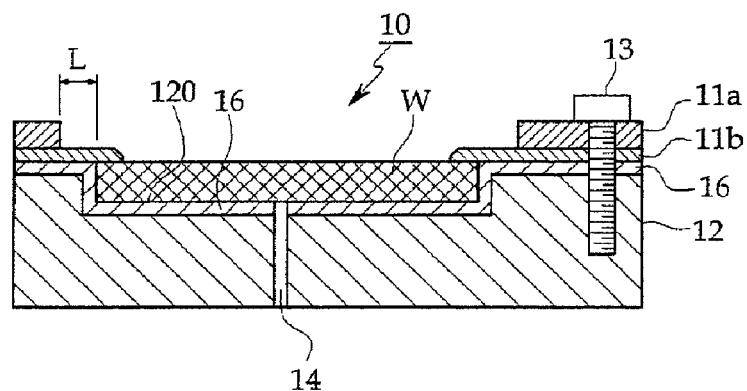

WAFER CHUCKING APPARATUS FOR PLASMA PROCESS

TECHNICAL FIELD

The present invention relates to a wafer chucking apparatus for a plasma process and, more particularly, to a wafer chucking apparatus for a plasma process, which improves uniformity of plasma-etched patterns occurring at the edge zone of each wafer during the plasma process.

BACKGROUND ART

In general, the surface of a substrate (or a wafer) is processed using plasma for a desired purpose. For example, in order to fabricate light emitting diodes (LEDs) using a sapphire wafer to increase brightness of light, a surface of the sapphire wafer is etched in embossed patterns having a hemispherical lens shape, so that the brightness of the emitted light is increased. In this manner, in order to from the embossed patterns on the wafer surface, the wafer is covered with photoresist, is developed using a mask, and is etched by plasma etching.

In this plasma process, a wafer chucking apparatus for fixing and holding the wafer processed by the plasma in a processing chamber is required. This wafer chucking apparatus is called a tray or a wafer loader.

This conventional wafer chucking apparatus is disclosed in Korean Patent No. 10-0707996, which was granted to the applicant of the present invention.

The conventional wafer chucking apparatus includes a lower plate, on which a plurality of wafers is loaded, and an upper plate, which is coupled to an upper portion of the lower plate by a physical, mechanical tool such as a bolt and fixes the plurality of wafers loaded on the lower plate.

The lower plate of the conventional wafer chucking apparatus is formed so as to be able to load several pieces of wafers at a time, and stably transmits heat, which is generated from the wafer chucking apparatus by the plasma when the wafers are etched, to a plasma etching cathode (not shown).

However, in this conventional wafer chucking apparatus, the upper plate fixing the plurality of wafers loaded on the lower plate is made of ceramic or metal. Thus, due to properties of the material of the upper plate and a shape of the upper plate pressing the wafers, particularly a wide contact area with the wafers, etching uniformity is influenced by the heat, which is generated from the wafer chucking apparatus by the plasma when the wafers are etched, and a plasma field, so that hemispherical lens patterns are distorted at an edge zone of each wafer, and lean to one side.

DISCLOSURE

Technical Problem

Accordingly, the present invention has been made to solve the above-mentioned problems occurring in the prior art. An object of the present invention is to provide a wafer chucking apparatus for a plasma process, which minimizes a sign of heat flow generated from the edge zone of a wafer during the plasma process, maximizes etching uniformity at the edge zone of the wafer, and has higher etching selectivity with respect to the thickness of a photosensitive solution, thereby improving a yield of light emitting diodes obtained from each wafer.

Technical Solution

In order to solve the problems occurring in the related art, according to an aspect of the present invention, there is provided a wafer chucking apparatus for a plasma process, which includes a lower plate on which a plurality of wafers are loaded, and an upper plate that is coupled to an upper portion of the lower plate and fixes the loaded wafers, and which holds the wafers during the plasma process. The upper plate is made of one of Teflon, ceramic and metal, and the lower plate is made of aluminum or ceramic. The lower plate includes a drilled gas feed hole through which gas is fed so as to uniformly maintain temperature of each wafer during the plasma process.

According to another aspect of the present invention, there is provided a wafer chucking apparatus for a plasma process, which includes a lower plate on which a plurality of wafers are loaded, and an upper plate that is coupled to an upper portion of the lower plate and fixes the loaded wafers, and which holds the wafers during the plasma process. One of more of an isothermal sheet and an isothermal coating layer is formed between the wafers and the lower plate so as to maintain temperature uniformity of the wafers.

Here, the upper plate includes a first upper plate and a second lower plate, the second upper plate being coupled to an upper portion of the lower plate and fixing the wafers, and the first upper plate being spaced apart from each wafer by a safety distance and being coupled and fixed to an upper portion of the first upper plate.

Advantageous Effects

As described above, according to the present invention, the wafer chucking apparatus can improve uniformity of plasma-etched patterns at an edge zone of each wafer during the plasma process to thereby enhance the yield of wafers, and have a variety of optional ranges in conjunction with control of process conditions for the plasmas etching.

Further, the wafer chucking apparatus can guarantee the maximum yield of wafers used for producing the light emitting diodes.

DESCRIPTION OF DRAWINGS

FIG. 1 is a cross-sectional view illustrating a wafer chucking apparatus for a plasma process according to the present invention.

FIG. 2 is a cross-sectional view illustrating a wafer chucking apparatus for a plasma process, which includes an isothermal sheet for heat uniformity of each wafer, according to the present invention.

FIG. 3 is a cross-sectional view illustrating a wafer chucking apparatus for a plasma process, which includes an isothermal sheet and a gas feed hole for heat uniformity of each wafer, according to the present invention.

FIG. 4 is a cross-sectional view illustrating an example of a wafer chucking apparatus for a plasma process, which includes a multiple upper plate and an isothermal coating, according to the present invention.

FIG. 5 is a cross-sectional view illustrating another example of a wafer chucking apparatus for a plasma process, which includes a multiple upper plate and an isothermal coating, according to the present invention.

FIG. 6 is a cross-sectional view illustrating yet another example of a wafer chucking apparatus for a plasma process, which includes a multiple upper plate and an isothermal coating, according to the present invention.

DESCRIPTION OF REFERENCE NUMBERS OF MAIN PARTS IN DRAWINGS

W: wafer
10: wafer chucking apparatus 11, 11a, 11b: upper plate
12: lower plate
13: bolt
14: gas feed hole
15: isothermal sheet
16: isothermal coating layer
L: safety distance
120: seat

BEST MODE

Hereinafter, the present invention will be described in detail.

A wafer chucking apparatus 10 for a plasma process according to the present invention includes a lower plate 12, on which a plurality of wafers W is loaded, and an upper plate 11, which is coupled to an upper portion of the lower plate 12 by a physical, mechanical tool such as a bolt 13 and fixes the plurality of wafers W loaded on the lower plate 12, and thus is adapted to fix the wafers W during the plasma process.

The upper plate 11 is made up of at least one plate made of metal or nonmetal.

The lower plate 12 is attached with a sheet based on resin having an isothermal characteristic or is coated with a resin-based material, thereby allowing heat, which is generated from each wafer W while plasma etching is performed, to be stably transmitted to a plasma etching cathode (not shown) in a uniform manner so as to maintain a processing temperature of each wafer W.

Particularly, the upper plate 11 is made of one selected from stainless steel, Monel (alloy 400), Inconel 600, hastalloy, nickel (Ni) alloy, copper (Cu) alloy, cobalt (Co) alloy, tungsten (W) alloy, aluminum (Al) alloy (Al 6000 series and Al 7000 series), and ceramic (Al 203 crystalline or amorphous material), and has a thickness between 0.02 mm to 5 nm. The upper plate is fabricated and used according to a size, a thickness, and a shape of each wafer W for the processing.

The lower plate 12 is made of aluminum alloy (Al 6000 series and Al 7000 series) or ceramic, and includes an isothermal coating layer on the surface thereof on which the wafers W is loaded, or is attached a thin isothermal sheet 15 on one face of which an adhesive is formed. At this time, an ingredient of the adhesive for attaching the isothermal sheet 15 is composed of silicon of 80% or more and additive.

Further, the isothermal coating layer 16 includes one selected from acryl-based resin, Teflon-based resin and polyimide-based resin. The Teflon-based resin includes one selected from polychlorotrifluoroethylene (PCTFE), polytetrafluoroethylene (PTFE), and perfluoroalkoxy (PFA).

MODE FOR INVENTION

Reference will now be made in greater detail to exemplary embodiments of the present invention, an example of which is illustrated in the accompanying drawings.

FIG. 1 is a cross-sectional view illustrating a wafer chucking apparatus for a plasma process according to the present invention.

As illustrated in FIG. 1, the wafer chucking apparatus 10 for a plasma process according to the present invention includes a lower plate 12, on which a plurality of wafers W is loaded, and an upper plate 11, which is coupled to an upper portion of the lower plate 12 by a physical, mechanical tool such as a bolt 13 and fixes the plurality of wafers W loaded on the lower plate 12, and thus is adapted to fix the wafers W during the plasma process.

The wafer chucking apparatus 10 configured as described above, is installed in a processing chamber (not shown) in order to perform plasma etching on the wafers.

The upper plate 11 is made of one selected from Teflon, ceramic and metal. The lower plate 12 is made of aluminum or ceramic, and is formed as an electrode for generating plasma in the processing chamber to etch the wafers.

The upper plate 11 is made of one selected from Teflon, ceramic and metal so as to prevent heat generated when the plasma etching is performed from being transmitted to the wafers W and to have higher etching selectivity with respect to the thickness of a photosensitive solution even when lower power is applied for an etching time, and fixes the wafers W.

Particularly, among the materials of the upper plate 11, the Teflon includes one selected from polychlorotrifluoroethylene (PCTFE), polytetrafluoroethylene (PTFE), and perfluoroalkoxy (PFA). This is because the Teflon has non-sticking, non-wetting, heat resistance, low-temperature stability, and chemical resistance, and thus minimizes a sign of heat flow generated at an edge zone of each wafer W when the heat transmitted from the lower plate 12 is transmitted to the wafers W through the upper plate 11 during the process. Further, the Teflon has low heat transfer under the same conditions, so that it can realize low consumption of power.

Further, the upper plate 11 formed of the aforementioned material is fabricated in an appropriate shape, and then fixes the wafers W so as to have low heat transfer under the same conditions and maintain plasma uniformity up to the edge zone of each wafer W. Thereby, after the wafers W are etched, pattern uniformity can be obtained to the maximum extent.

In detail, the upper plate 11 has an approximately rectangular shape, and is chamfered along upper edges thereof to form inclined faces.

Thus, the upper plate 11 having such inclined upper edges presses the wafers W with a minimum area, and thus minimizes an influence caused by a field and the heat flow generated when the plasma etching is performed. The heat generated during the plasma etching is transmitted to the electrode having a cooling function, so that the patterns can be uniformly formed up to the edge zone of each wafer W by the mechanical pressing of the wafers W.

Thus, the uniformity of the patterns can be ensured to the maximum extent.

Further, the lower plate 12 is provided with a seat 120 in which the wafers W are placed, and a gas feed hole 14 in the center thereof which is drilled in a vertical direction and through which gas is fed to the seat 120 such that the heat, namely the temperature can be uniformly maintained at the wafers W during the plasma process.

The gas fed through the gas feed hole 14 includes inert gas (mainly, helium gas) or nitrogen gas.

FIG. 2 is a cross-sectional view illustrating a wafer chucking apparatus for a plasma process, which includes an isothermal sheet for heat uniformity of each wafer, according to the present invention. FIG. 3 is a cross-sectional view illustrating a wafer chucking apparatus for a plasma process, which includes an isothermal sheet and a gas feed hole for heat uniformity of each wafer, according to the present invention.

As illustrated in FIGS. 2 and 3, the seat 120 of the lower plate 12 onto which the wafers W are loaded is provided with an isothermal sheet 15 for maintaining temperature uniformity of the wafers W and providing higher etching selectivity, thereby preventing high-temperature heat of the wafers W from being transmitted to and cooled at the lower plate 12. This heat transfer is responsible for poor patterns.

This isothermal sheet 15 is made of one selected from Teflon-based resin, acryl-based resin, and polyimide-based resin at a thickness from 0.05 mm to 3 mm, and has an adhesive of silicon on one surface thereof so as to be fixedly attached to the upper surface of the lower plate 12.

Meanwhile, the thickness of the isothermal sheet 15 is varied depending on types of the wafers W. The isothermal sheet 15 can be replaced by an isothermal coating layer, which will be described below.

Further, as illustrated in FIG. 3, the lower plate 12 includes the gas feed hole 14, through which the gas is fed between the wafers W and the seat 120 during the plasma process, thereby interrupting the heat transfer to maintain fixed temperature. The gas feed hole 14 passes through the lower plate 12 as well as the isothermal sheet 15.

The gas fed through the gas feed hole 14 includes inert gas (mainly, helium gas) or nitrogen gas.

FIG. 4 is a cross-sectional view illustrating an example of a wafer chucking apparatus for a plasma process, which includes a multiple upper plate and an isothermal coating, according to the present invention. FIG. 5 is a cross-sectional view illustrating another example of a wafer chucking apparatus for a plasma process, which includes a multiple upper plate and an isothermal coating, according to the present invention. FIG. 6 is a cross-sectional view illustrating yet another example of a wafer chucking apparatus for a plasma process, which includes, a multiple upper plate and an isothermal coating, according to the present invention.

As illustrated in FIGS. 4, 5 and 6, the multiple upper plate is made up of a first upper plate 11a and a second upper plate 11b.

The second upper plate 11b of the upper plates 11a and 11b configured as described above is coupled to the upper portion of the lower plate 12 onto which the wafers W are loaded, and fixes the wafers W. The first upper plate 11a is coupled and fixed to an upper portion of the second upper plate 11b.

At this time, like the upper plate 11 of the abovementioned embodiment, the second upper plate 11b is chamfered along upper edges thereof to form inclined faces, or has a rectangular shape, and then presses the wafers W, so that it minimizes an influence caused by a field and the heat flow generated when the plasma etching is performed. The heat generated during the plasma etching is transmitted to the electrode having a cooling function through the lower plate, so that the patterns can be uniformly formed up to the edge zone of each wafer W by the mechanical pressing of the wafers W. As a result, the uniformity of the patterns can be ensured to the maximum extent.

Meanwhile, the first upper plate 11a is provided with a hole in the central portion thereof, the diameter of which is greater than that of the second upper plate 11b, and the inner circumference of which is spaced from the outer circumference of each wafer W by a safety distance L from 1 mm to 12 mm. This safety distance L is selected according to types of wafers W.

Further, the first and second upper plates 11a and 11b configured as described above have the thickness selected within a range from 0.02 mm to 5 mm according to types of wafers W, and are made of metal alloy or ceramic.

The first and second upper plates 11a and 11b are made of one selected from stainless steel, Monel (alloy 400), Inconel 600, hastalloy, Ni alloy, Cu alloy, Co alloy, W alloy, Al alloy (Al 6000 series and Al 7000 series), and ceramic (Al 203 crystalline or amorphous material).

The seat 120 of the lower plate 12 includes an isothermal coating layer 16 for maintaining temperature uniformity of the wafers W and providing higher etching selectivity. The isothermal coating layer 16 has the same function as the aforementioned isothermal sheet 15.

In other words, when the high-temperature heat generated from the wafers W by the plasma etching is non-uniformly transferred to and cooled at the lower plate 12, the patterns may not be accurately formed. Thus, the heat transfer is made slow such that the wafers W can be maintained at fixed temperature.

Of course, the isothermal coating layer 16 can be replaced by the isothermal sheet 15. Alternatively, the isothermal coating layer 16 may be used in combination with the isothermal sheet 15.

Meanwhile, the isothermal coating layer 16 is made of acryl-based resin or Teflon-based resin at a thickness from 0.02 mm to 5 mm. The Teflon-based resin includes one selected from PCTFE, PTFE and PFA.

The thickness of the isothermal coating layer 16 is preferably varied depending on types of the wafers W like the aforementioned isothermal sheet 15.

Further, as illustrated in FIG. 5, the isothermal coating layer 16 is formed on the upper surface as well as the inner sidewall of the seat 120, thereby enclosing the bottom surface of the lowermost wafer as well as the outer circumferences of the wafers W.

As illustrated in FIG. 6, the isothermal coating layer 16 is formed on the upper surface and the inner sidewall of the seat 120, and the upper surface of the lower plate 120. Thereby, when the plasma etching is performed, the upper surface of the lower plate of the wafer chucking apparatus 10, on which the plurality of wafers W is loaded, can be maintained at uniform temperature.

Also, as illustrated in FIGS. 4 through 6, the lower plate 12 has the vertically drilled gas feed hole 14 for applying the gas, namely the medium of the heat transfer such that the gas is fed between the wafers W and the seat 120 during the plasma process in order to compensate for non-uniformity of the heat transfer caused by physical surface close contact between the wafers W and the lower plate 12.

The gas feed hole 14 preferably passes through the lower plate 12 as well as the isothermal coating layer 16.

The gas fed through the gas feed hole 14 includes inert gas (mainly, helium gas) or nitrogen gas.

Although exemplary embodiments of the present invention have been described for illustrative purposes, those skilled in the art will appreciate that various modifications, additions and substitutions are possible, without departing from the scope and spirit of the invention as disclosed in the accompanying claims.

The invention claimed is:

1. A wafer chucking apparatus for a plasma process, comprising:
   a lower plate, on which a plurality of wafers are loaded; and
   an upper plate, which is coupled to an upper portion of the lower plate and fixes the loaded wafers,
   wherein the upper plate has a rectangular shape so as to press the wafers, and is chamfered along upper edges thereof to form inclined faces,
   the lower plate includes a seat in which the wafers are placed, and a gas feed hole in a center thereof in order to feed gas to the seat,
   the seat of the lower plate includes at least one of an isothermal sheet and an isothermal coating layer, and
   the isothermal sheet includes one selected from Teflon-based resin, acryl-based resin, and polyimide-based resin at a thickness from 0.05 mm to 3 mm, and has an adhesive of silicon on one surface thereof.

2. The wafer chucking apparatus according to claim 1, wherein the isothermal coating layer includes one selected from the acryl-based resin, the Teflon-based resin, and the polyimide-based resin at a thickness from 0.02 mm to 5 mm, the Teflon-based resin including one selected from polychlorotrifluoroethylene (PCTFE), polytetrafluoroethylene (PTFE), and perfluoroalkoxy (PFA).

3. The wafer chucking apparatus according to claim 1, wherein the upper plate includes one selected from Teflon, ceramic and metal.

4. The wafer chucking apparatus according to claim 3, wherein the metal includes one selected from one selected from stainless steel, Monel (alloy 400), Inconel 600, hastalloy, nickel (Ni) alloy, copper (Cu) alloy, cobalt (Co) alloy, tungsten (W) alloy, and aluminum (Al) alloy (Al 6000 series and Al 7000 series).

5. The wafer chucking apparatus according to claim 1, wherein the lower plate includes one of aluminum and ceramic.

6. The wafer chucking apparatus according to claim 1, wherein one of the isothermal sheet or the isothermal coating layer is formed on an upper surface and an inner sidewall of the seat.

7. The wafer chucking apparatus according to claim 1, wherein one of the isothermal sheet or the isothermal coating layer is formed on an upper surface and an inner sidewall of the seat and the upper portion of the lower plate.

8. A wafer chucking apparatus for a plasma process, comprising:
   a lower plate, on which a plurality of wafers are loaded; and
   an upper plate, which is coupled to an upper portion of the lower plate and fixes the loaded wafers,
   wherein the upper plate includes a first upper plate and a second lower plate, the second upper plate being coupled to an upper portion of the lower plate and fixing the wafers, and the first upper plate being spaced apart from each wafer by a safety distance and being coupled and fixed to an upper portion of the first upper plate,
   the lower plate includes a seat in which the wafers are placed, and a gas feed hole in a center thereof in order to feed gas to the seat, and
   the seat of the lower plate includes at least one of an isothermal sheet and an isothermal coating layer.

9. The wafer chucking apparatus according to claim 8, wherein the safety distance has a range from 1 mm to 12 mm with respect to an outer circumference of each wafer.

10. The wafer chucking apparatus according to claim 8, wherein the first and second upper plates have a thickness selected within a range from 0.02 mm to 5 mm, and are made of one of metal alloy and ceramic.

11. The wafer chucking apparatus according to claim 10, wherein the metal alloy includes one selected from one selected from stainless steel, Monel (alloy 400), Inconel 600, hastalloy, nickel (Ni) alloy, copper (Cu) alloy, cobalt (Co) alloy, tungsten (W) alloy, and aluminum (Al) alloy (Al 6000 series and Al 7000 series).

12. The wafer chucking apparatus according to claim 2, wherein the upper plate includes one selected from Teflon, ceramic and metal.

13. The wafer chucking apparatus according to claim 12, wherein the metal includes one selected from one selected from stainless steel, Monel (alloy 400), Inconel 600, hastalloy, nickel (Ni) alloy, copper (Cu) alloy, cobalt (Co) alloy, tungsten (W) alloy, and aluminum (Al) alloy (Al 6000 series and Al 7000 series).

14. The wafer chucking apparatus according to claim 2, wherein the lower plate includes one of aluminum and ceramic.

15. The wafer chucking apparatus according to claim 2, wherein one of the isothermal sheet or the isothermal coating layer is formed on an upper surface and an inner sidewall of the seat.

16. The wafer chucking apparatus according to claim 2, wherein one of the isothermal sheet or the isothermal coating layer is formed on an upper surface and an inner sidewall of the seat and the upper portion of the lower plate.

* * * * *